United States Patent [19]

McPherson et al.

[11] Patent Number: 4,633,185

[45] Date of Patent: Dec. 30, 1986

[54] CHIRP SIGNAL GENERATOR FOR PULSE COMPRESSION RADAR

[75] Inventors: Hugh McPherson, Tweeddale; John P. Blakely, Edinburgh, both of Scotland

[73] Assignee: Ferranti plc, Cheshire, England

[21] Appl. No.: 539,558

[22] Filed: Oct. 6, 1983

[30] Foreign Application Priority Data

Oct. 16, 1982 [GB] United Kingdom ................. 8229617

[51] Int. Cl.$^4$ ...................... H03K 5/159; H03C 3/00; H03C 3/28

[52] U.S. Cl. .................................. 328/56; 332/16 R; 332/26; 455/42; 333/150

[58] Field of Search ........................ 328/34, 55, 56, 58, 328/66, 150; 307/265, 260, 267; 332/1, 9 R, 16 R, 26; 329/110; 375/23, 22; 455/23, 20 S, 42; 343/17.1 R, 17.1 PW, 17.2 R, 17.2 PC, 13 R, 14; 333/150, 154; 331/107 A, 155

[56] References Cited

U.S. PATENT DOCUMENTS

| | | | |
|---|---|---|---|
| 2,949,028 | 8/1960 | Joy | 343/17.2 R |
| 3,176,296 | 3/1965 | Adams | 343/17.2 PC |
| 3,376,572 | 4/1968 | Mayo | 343/17.2 R |
| 3,686,572 | 8/1972 | Guilhem et al. | 343/17.2 PC |
| 3,956,646 | 5/1976 | Shibayama et al. | 333/150 |
| 4,099,182 | 7/1978 | Ward | 343/17.2 PC |
| 4,100,498 | 7/1978 | Alsup et al. | 333/150 |
| 4,521,779 | 6/1985 | Lewis | 343/17.2 PC |

FOREIGN PATENT DOCUMENTS 1379863 1/1975 United Kingdom .

Primary Examiner—Stanley D. Miller
Assistant Examiner—Timothy P. Callahan
Attorney, Agent, or Firm—Kerkam, Stowell, Kondracki & Clarke

[57] ABSTRACT

A chirp signal generator circuit includes a pulse generator PG for generating a single impulse for application to first surface acoustic wave device SAW. This device produces an output signal comprising several cycles of energy at a predetermined frequency. A threshold circuit TH passes only that part of the output signal which second surface acoustic wave device EXP having the predetermined frequency as its center frequency, and this output signal is then amplified. The second device EXP generates a frequency modulated chirp signal.

4 Claims, 5 Drawing Figures

CHIRP SIGNAL GENERATOR FOR PULSE COMPRESSION RADAR

This invention relates to a chirp signal generator for use with pulse compression radar systems.

In modern pulse compression radar systems the transmitted signal is a long frequency-modulated pulse or "chirp", frequency produced by a surface acoustic wave or "SAW" device known as an "expander". On reception the received pulse is compressed by a further SAW device in the form of a dispersive delay line having amplitude and phase responses matching those of the transmitted pulse, and known as a "compressor".

The chirp signal is generated by exciting the expander with a suitable short duration impulse. Preferably such an impulse consists of several cycles of radio-frequency energy at the centre frequency of the expander. In practice the bandwidth of the impulse must be greater than, or at least equal to, that of the expander for all frequencies in the signal.

The short duration impulse may be produced using an oscillator operating at the required frequency. The oscillator may be free-running with its output gated to produce the necessary pulse, but the problem with this technique is that the oscillator could cause interference and also requires continuous power to operate. An alternative is to switch the oscillator on and off to generate a single short duration pulse for application to the expander. However the energy content of such a pulse is low.

It is an object of the invention to provide a chirp signal generator for a pulse compression radar which avoids the problems referred to above.

According to the present invention there is provided a chirp signal generator for a pulse compression radar which includes a pulse generator for generating a single impulse, a first surface acoustic wave delay line responsive to said impulse to produce an output signal comprising several cycles of energy at a predetermined frequency, a threshold circuit operable to pass only that portion of said output signal which exceeds a preset amplitude, and a second surface acoustic wave delay line having said predetermined frequency as its centre frequency and responsive to the output of the threshold circuit to deliver a frequency modulated signal.

An embodiment of the invention will now be described with reference to the accompanying drawings, in which.

Figure 1:
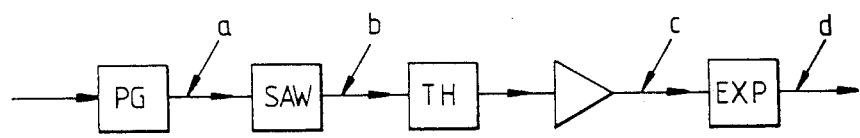
FIG. 1 is a schematic block diagram of the circuit.
Figure 2:
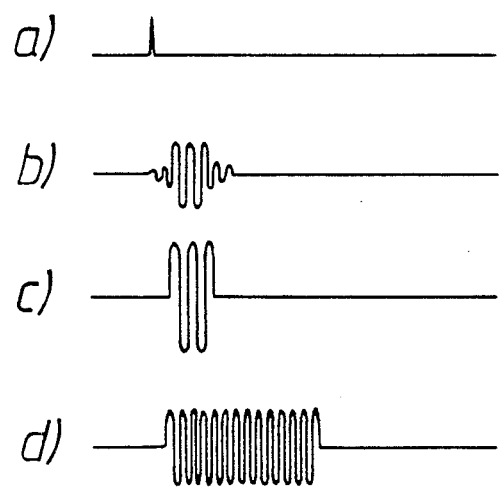
FIGS. 2a through 2d show waveforms produced at various parts of the circuit of FIG. 1.

Referring now to FIGS. 1 and 2a–2d, a pulse generator PG has a trigger input from a source and delivers a short impulse of the form shown at FIG. 2a. Such an impulse has a low energy content and wide band-width, and is applied to the input of a first surface acoustic wave device SAW. This is arranged, by its construction, to respond to the impulse by generating several cycles of energy. The output of SAW is shown in FIG. 2b, and is applied to a threshold circuit TH arranged such that it responds only to incoming signals above a preset threshold level. Amplification also takes place, so that the output of the amplifier AMP is an amplified form of the full-amplitude portion of the output of the first surface acoustic wave device. FIG. 2c shows the form of the output of the threshold circuit. This output is applied to the second SAW device, the expander EXP. This operates to produce a frequency-modulated output signal centred about the centre frequency of the expander, as shown at FIG. 2d.

The threshold circuit may be a Class-B amplifier, which conveniently combines the threshold requirement with signal amplification to obtain the highest efficiency from the expander. In addition, the Class-B amplifier uses less power than other forms of amplifier since it draws power only for the time that the signal is above the threshold level. The amplifier may be designed in such a way as to limit the signal, or a separate limiting circuit may be included.

The use of a pulse generator PG to generate a single pulse when required, even if at a steady rate, also uses less power than a free-running oscillator, and avoids the possible interference problems associated with a free-running oscillator.

The two surface-acoustic wave devices may be of any type commonly used at the necessary frequencies. These include quartz inter-digital devices and lithium niobate reflective array compressor devices.

What we claim is:

1. A chirp signal generator which includes:
    a pulse generator for generating a single impulse,
    a first surface acoustic wave delay line responsive to said impulse to produce an output signal comprising several cycles of energy at a predetermined frequency,
    a threshold circuit operable to pass only that portion of said output signal which exceeds a preset amplitude, and
    a second surface acoustic wave delay line having said predetermined frequency as its centre frequency and responsive to the output of the threshold circuit to deliver a frequency modulated pulse comprising a chirp signal.

2. A circuit as claimed in claim 1 in which the threshold circuit includes an amplifier for amplifying that part of the signal which exceeds said preset amplitude.

3. A circuit as claimed in claim 2 in which the threshold circuit comprises a Class-B amplifier circuit.

4. A circuit as claimed in claim 1 in which at least one of the surface acoustic wave delay lines comprises an inter-digital device.

* * * * *